(12) United States Patent
Fukuda

(10) Patent No.: US 10,622,060 B2
(45) Date of Patent: Apr. 14, 2020

(54) INTEGRATED CIRCUIT INCLUDING A PLURALITY OF SRAMS

(71) Applicants: KABUSHIKI KAISHA TOSHIBA, Minato-ku (JP); Toshiba Electronic Devices & Storage Corporation, Minato-ku (JP)

(72) Inventor: Toshikazu Fukuda, Yokohama (JP)

(73) Assignees: KABUSHIKI KAISHA TOSHIBA, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 0 days.

(21) Appl. No.: 16/122,155

(22) Filed: Sep. 5, 2018

(65) Prior Publication Data
US 2019/0295628 A1    Sep. 26, 2019

(30) Foreign Application Priority Data
Mar. 23, 2018  (JP) ................................. 2018-055974

(51) Int. Cl.
| | | |
|---|---|---|
| *G11C 11/417* | (2006.01) | |
| *G11C 11/412* | (2006.01) | |
| *G11C 5/06* | (2006.01) | |
| *H01L 27/11* | (2006.01) | |

(52) U.S. Cl.
CPC .............. *G11C 11/417* (2013.01); *G11C 5/06* (2013.01); *G11C 11/412* (2013.01); *H01L 27/1104* (2013.01)

(58) Field of Classification Search
CPC ....... G11C 11/417; G11C 5/06; G11C 11/412; H01L 27/1104
See application file for complete search history.

(56) References Cited

U.S. PATENT DOCUMENTS

| | | | |
|---|---|---|---|
| 7,200,030 B2 | 4/2007 | Yamaoka et al. | |
| 7,420,857 B2 | 9/2008 | Hirota et al. | |
| 7,437,632 B2* | 10/2008 | Marr ...................... | G11C 29/83 365/201 |
| 8,854,869 B2 | 10/2014 | Komatsu et al. | |
| 9,734,893 B2* | 8/2017 | Komatsu .................. | G11C 5/06 |

FOREIGN PATENT DOCUMENTS

| | | |
|---|---|---|
| JP | 2007-122814 | 5/2007 |
| JP | 4388274 | 12/2009 |
| JP | 5317900 | 10/2013 |

* cited by examiner

*Primary Examiner* — Gene N Auduong
(74) *Attorney, Agent, or Firm* — Oblon, McClelland, Maier & Neustadt, L.L.P.

(57) ABSTRACT

According to one embodiment, there is provided an integrated circuit. The integrated circuit includes a plurality of SRAMs including a first SRAM and a second SRAM, and a switching unit that enables switching between an electrically connected state where a first circuit portion on a source side of the first SRAM is electrically connected with a second circuit portion on a source side of the second SRAM and an electrically disconnected state where the first circuit portion is electrically disconnected from the second circuit portion.

12 Claims, 4 Drawing Sheets

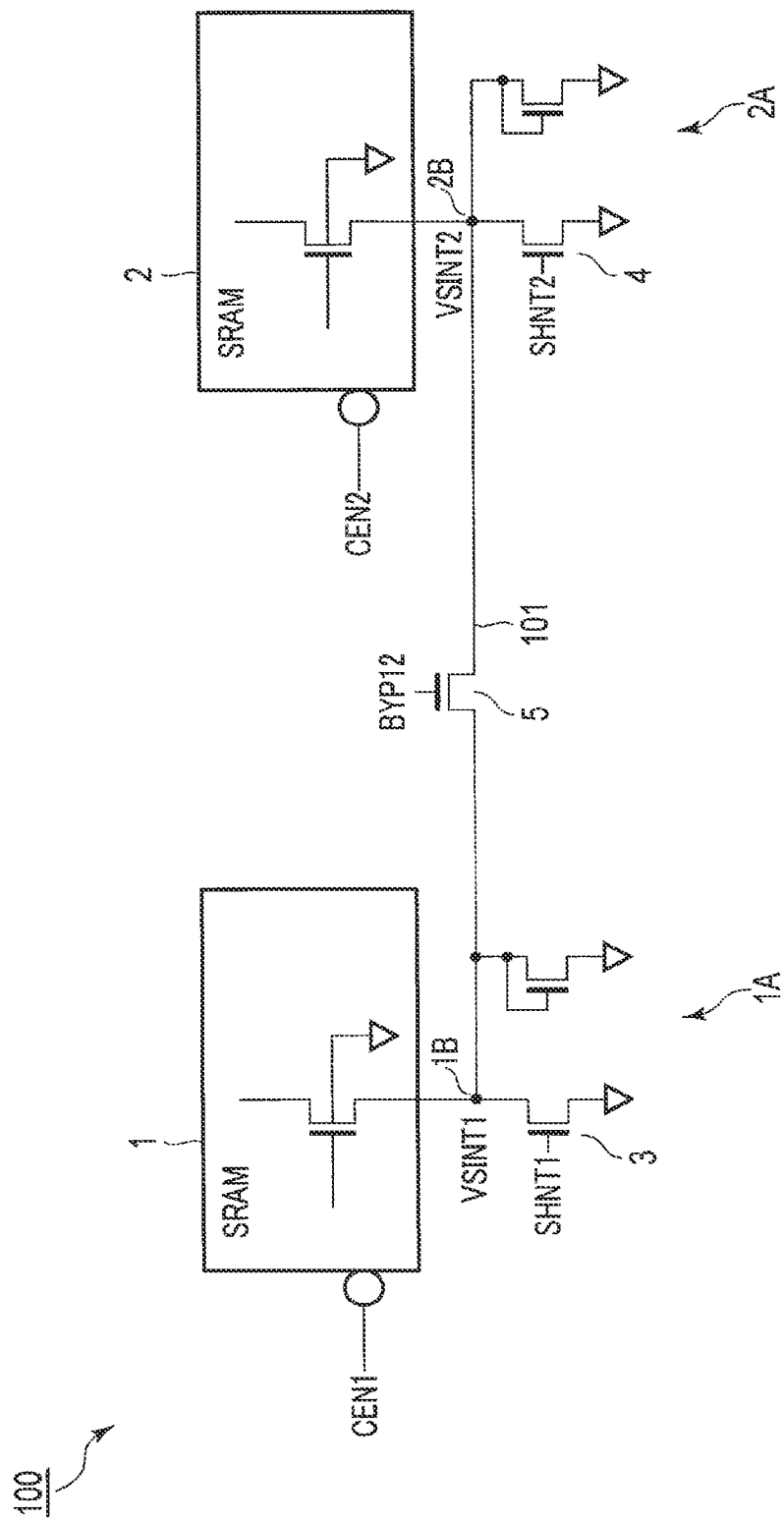
F I G. 1

INTEGRATED CIRCUIT INCLUDING A PLURALITY OF SRAMS

CROSS-REFERENCE TO RELATED APPLICATIONS

This application is based upon and claims the benefit of priority from Japanese Patent Application No. 2018-055974, filed Mar. 23, 2018, the entire contents of which are incorporated herein by reference.

FIELD

Embodiments described herein relate generally to an integrated circuit.

BACKGROUND

During an operation of a semiconductor integrated circuit including a plurality of static random access memories (SRAMs), a leakage current flows from a metal-oxide-semiconductor field-effect-transistor (MOSFET) of the SRAM in a non-access state, thereby increasing current consumption in the entire semiconductor integrated circuit.

There is a method of applying a reverse bias between a substrate and a source as a technique for reducing the leakage current, but a long non-access time is required in order to obtain a leakage current reduction effect.

BRIEF DESCRIPTION OF THE DRAWINGS

FIG. 1 is a schematic diagram illustrating a configuration of a part of a semiconductor integrated circuit according to an embodiment;

DETAILED DESCRIPTION

Figure 2:
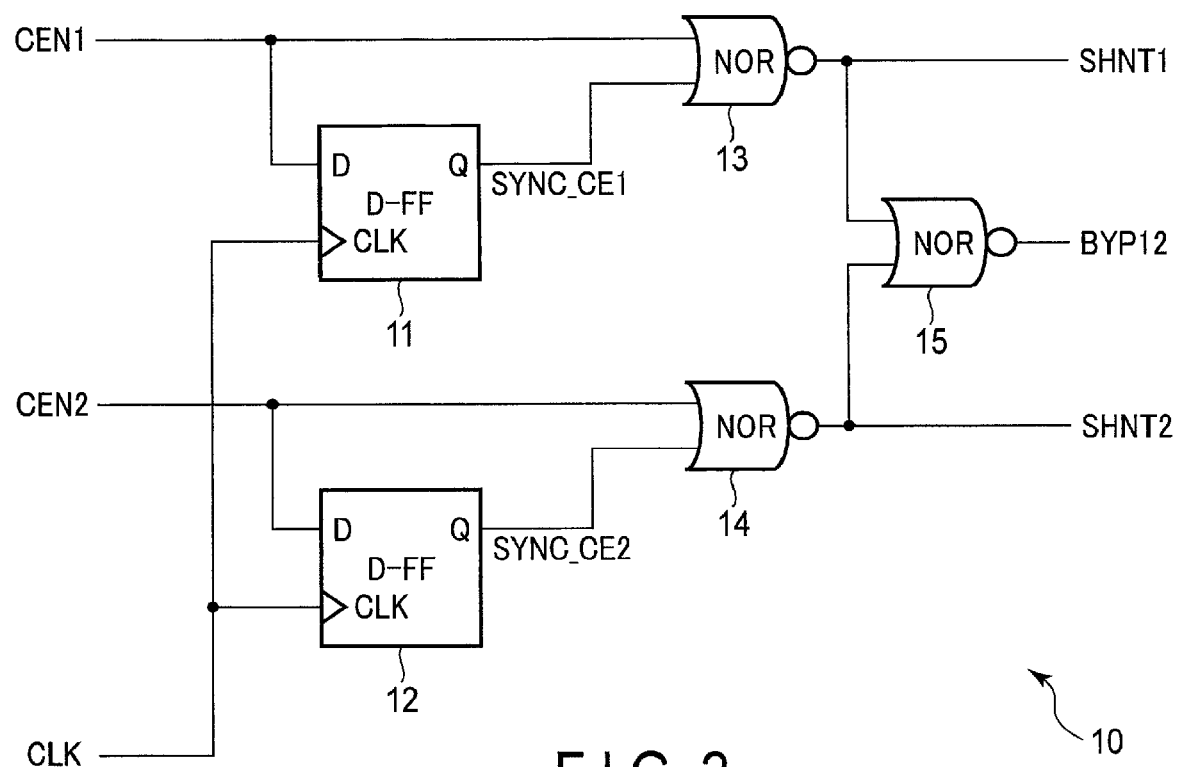
FIG. 2 is a diagram illustrating an example of a configuration of a logic circuit to generate signals for operating a shunt switch and a bypass switch.

Hereinafter, embodiments will be described with reference to the accompanying drawings.

In general, according to one embodiment, there is provided an integrated circuit. The integrated circuit includes a plurality of SRAMs including a first SRAM and a second SRAM, and a switching unit that enables switching between an electrically connected state where a first circuit portion on a source side of the first SRAM is electrically connected with a second circuit portion on a source side of the second SRAM and an electrically disconnected state where the first circuit portion is electrically disconnected from the second circuit portion.

FIG. 1 is a schematic diagram illustrating a configuration of a part of a semiconductor integrated circuit according to the embodiment.

A semiconductor integrated circuit 100 is a circuit including a plurality of SRAMs. Only a part of the circuit related to the two SRAMs is cut out and illustrated in FIG. 1. During an operation of the semiconductor integrated circuit 100, a leakage current flows from a transistor of the SRAM in a non-access state to a source side.

Although each SRAM includes a plurality of transistors, the plurality of transistors is collectively represented by one symbol in FIG. 1. Although a case where the number of the plurality of transistors is, for example, six is assumed, the number is not limited thereto, and may be, for example, eight or a different number.

Further, a case where a transfer transistor and a driving transistor included in each SRAM are N-type MOSFETs (NMOS transistors) is assumed here, but the invention is not limited thereto, and may be implemented using P-type MOSFETs (PMOS transistors).

As illustrated in FIG. 1, the semiconductor integrated circuit 100 includes an SRAM 1 and an SRAM 2. The SRAMs 1 and 2 are turned on or off according to chip enable signals CEN1 and CEN2, respectively. Each of the chip enable signals CEN1 and CEN2 enables the corresponding SRAM when a level is low and disabled the corresponding SRAM when the level is high.

An internal potential generation circuit 1A that generates an internal potential VSINT1 is provided on a source side of the SRAM 1. Similarly, an internal potential generation circuit 2A that generates an internal potential VSINT2 is provided on a source side of the SRAM 2. Each internal potential generation circuit is arranged at the outer side of a cell array.

The internal potential generation circuit 1A includes a shunt switch 3 that enables switching between an electrically connected state where a circuit portion 1B having the internal potential VSINT1 is electrically connected with the ground and an electrically disconnected state where the circuit portion 1B is electrically disconnected from the ground. The shunt switch 3 is turned on or off by a shunt signal SHNT1 supplied from a logic circuit to be described later. The shunt switch 3 is turned into an on-state when a level of the shunt signal SHNT1 is high, and the shunt switch 3 is turned into an off-state when the level of the shunt signal SHNT1 is low. The circuit portion 1B is electrically connected with the ground when the shunt switch 3 is in the on-state, and the circuit portion 1B is electrically disconnected from the ground when the shunt switch 3 is in the off-state.

The internal potential generation circuit 2A includes a shunt switch 4 that enables switching between an electrically connected state where a circuit portion 2B having the internal potential VSINT2 is electrically connected with the ground and an electrically disconnected state where the circuit portion 2B is electrically disconnected from the ground. The shunt switch 4 is turned on or off by a shunt signal SHNT2 supplied from the logic circuit to be described later. The shunt switch 4 is turned into an on-state when a level of the shunt signal SHNT2 is high, and the shunt switch 4 is turned into an off-state when the level of the shunt signal SHNT2 is low. The circuit portion 2B is electrically connected with the ground when the shunt switch 4 is in the on-state, and the circuit portion 2B is electrically disconnected from the ground when the shunt switch 4 is in the off-state.

In the present embodiment, in particular, there is provided a switching unit which enables switching between an electrically connected state where the circuit portion 1B is electrically connected with the circuit portion 2B and an electrically disconnected state where the circuit portions is electrically disconnected from the circuit portion 2B. The switching unit is realized, for example, by using a bypass switch 5 as illustrated in FIG. 1. Specifically, a bypass line 101 connecting the circuit portion 1B and the circuit portion 2B is arranged, and the bypass switch 5 is provided at the bypass line 101. The bypass switch 5 is used for potential adjustment between the internal potential VSINT1 of the circuit portion 1B and the internal potential VSINT2 of the circuit portion 2B and is turned on or off by a bypass enable signal BYP12 supplied from the logic circuit to be described later.

The bypass switch 5 is configured using, for example, a transistor. However, the bypass switch is not limited to this example.

The bypass switch 5 is operated so as to electrically connect the circuit portion 1B with the circuit portion 2B when each of the SRAM 1 and the SRAM 2 is in a non-access period in which data read or write is not performed and each of the circuit portion 1B and the circuit portion 2B is electrically disconnected from the ground. When any of the circuit portion 1B and the circuit portion 2B is electrically connected with the ground, the bypass switch 5 is operated so as to electrically disconnect the circuit portion 1B and the circuit portion 2B from each other.

Here, it is considered a scene in which an access to the SRAM 1 during an access period is terminated and then an access to the SRAM 2 is started. It is assumed that a state where there is no access to the SRAM 2 continues for a certain period or longer, and the internal potential VSINT2 of the circuit portion 2B on the SRAM 2 side is higher than a ground level by a certain level or more and reaches a saturation level due to the leakage current.

The bypass switch 5 is operated so as to electrically connect the circuit portion 1B with the circuit portion 2B after the access to the SRAM 1 is terminated and before the access to the SRAM 2 is started. Specifically, the bypass switch 5 is operated so as to electrically connect the circuit portion 1B with the circuit portion 2B after the circuit portion 1B is electrically disconnected from the ground and before the circuit portion 2B is electrically connected with the ground. In this case, the shunt switch 3 is operated so that the circuit portion 1B is electrically disconnected from the ground at a first timing (for example, at a timing when the access to the SRAM 1 is terminated). Next, the shunt switch 4 is operated so that the circuit portion 2B is electrically connected with the ground at a second timing later than the first timing, for example, at a timing when the access to the SRAM 2 is started.

With such an operation, the internal potential VSINT1 of the circuit portion 1B and the internal potential VSINT2 of the circuit portion 2B are averaged to have the same potential. That is, the internal potential VSINT2 of the circuit portion 2B drops from the saturation level to a level about the half thereof, and the internal potential VSINT1 of the circuit portion 1B at the ground level immediately rises to the level about the half of the above saturation level.

If the bypass switch 5 and the bypass line 101 are not provided, the internal potential VSINT1 of the circuit portion 1B at the ground level does not immediately rise but slowly rises, and thus, a long non-access period is required until reaching a desired level, and the leakage current flows a lot in the meantime so that the current consumption as the entire circuit increases. In the present embodiment, however, the internal potential VSINT1 of the circuit portion 1B at the ground level immediately rises after the access to the SRAM 1 is terminated, and thus, it is possible to reduce the leakage current from an early stage of the non-access period so that it is possible to reduce the current consumption of the entire circuit.

Although an example of a case in which a ratio of the number of SRAMs existing on both sides of the bypass switch 5 is 1:1 is illustrated in the present embodiment, the ratio is not limited to this example and may be configured to be 1:n (where n is an integer of two or more). For example, the bypass switch 5 may be configured to be connected not only with the circuit portion 2B on the source side of the SRAM 2 but also with a circuit portion on a source side of other SRAM. That is, the bypass switch 5 may be configured to enable switching between the electrically connected state and the electrically disconnected state with respect to connection of the circuit portion on the source side of the SRAM 1 not only with the circuit portion 2B on the source side of the SRAM 2 but also with the circuit portion on the source side of other SRAM. In this case, additional bypass switch and bypass line may be added as appropriate.

Figure 3:
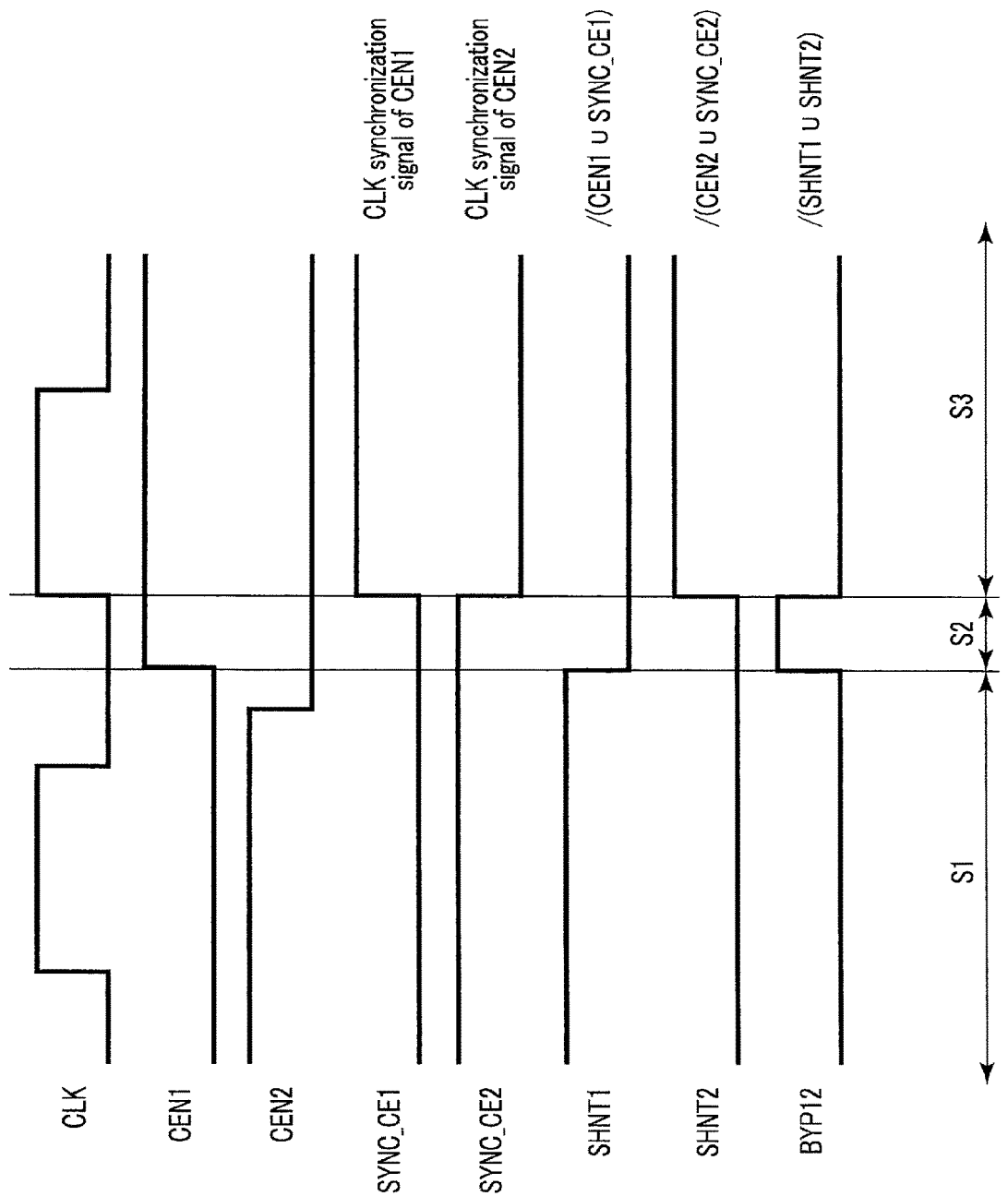
FIG. 3 is a view illustrating an example of a time chart illustrating changes in various signals related to the logic circuit.

FIG. 2 is a diagram illustrating an example of a configuration of the logic circuit that generates signals for operating the shunt switches 3 and 4 and the bypass switch 5. FIG. 3 is a view illustrating an example of a time chart illustrating changes in various signals related to the logic circuit. Each of FIGS. 2 and 3 illustrates one example, and is not limited thereto.

A logic circuit 10 illustrated in FIG. 2 is provided in the semiconductor integrated circuit 100 and includes flip-flop circuits 11 and 12, NOR circuits 13, 14, and 15, and the like.

The logic circuit 10 uses a clock signal CLK and the chip enable signals CEN1 and CEN2 to individually generate the shunt signal SHNT1 for turning on or off the shunt switch 3 and the shunt signal SHNT2 for turning on or off the shunt switch 4 and to generate the bypass enable signal BYP12 for turning on or off the bypass switch 5.

The flip-flop circuit 11 receives the chip enable signal CEN1 and the clock signal. CLK as inputs and outputs a chip enable clock synchronization signal SYNC_CE1 obtained by synchronizing a rising edge or a falling edge of the chip enable signal CEN1 with a rising edge of the subsequent clock signal CLK.

For example, when the chip enable signal CEN1 changes from low to high (when the chip enable signal CEN1 is disabled), the flip-flop circuit 11 changes the chip enable clock synchronization signal SYNC_CE1 from low to high at a timing at which the clock signal CLK thereafter changes from low to high.

The flip-flop circuit 12 receives the chip enable signal CEN2 and the clock signal CLK as inputs and outputs a chip enable clock synchronization signal SYNC_CE2 obtained by synchronizing a falling edge or a rising edge of the chip enable signal CEN2 with a rising edge of the subsequent clock signal CLK.

For example, when the chip enable signal CEN2 changes from high to low, the flip-flop circuit 12 changes the chip enable clock synchronization signal SYNC_CE2 from high to low at a timing at which the clock signal CLK thereafter changes from low to high.

The NOR circuit 13 receives the chip enable signal CEN1 and the chip enable clock synchronization signal SYNC_CE1 as inputs, and outputs a result of calculating a NOR of both the signals as the shunt signal SHNT1. The NOR circuit 13 sets the shunt signal SHNT1 to high only when both the chip enable signal CEN1 and the chip enable clock synchronization signal SYNC_CE1 are low.

For example, when the chip enable signal CEN1 changes from low to high in a state where both the chip enable signal CEN1 and the chip enable clock synchronization signal SYNC_CE1 are low, the NOR circuit 13 changes the shunt signal SHNT1 from high to low. At this time, the shunt switch 3 is switched from the on-state to the off-state.

The NOR circuit 14 receives the chip enable signal CEN2 and the chip enable clock synchronization signal SYNC_CE2 as inputs, and outputs a result of calculating a NOR of both the signals as the shunt signal SHNT2. The NOR circuit 14 sets the shunt signal SHNT2 to high only when both the chip enable signal CEN2 and the chip enable clock synchronization signal SYNC_CE2 are low.

For example, when the chip enable signal CEN2 changes from high to low and the chip enable clock synchronization signal SYNC_CE2 changes from high to low in a state where both the chip enable signal CEN2 and the chip enable clock synchronization signal SYNC_CE2 are high, the NOR circuit 14 changes the shunt signal SHNT2 from low to high. At this time, the shunt switch 3 is switched from the on-state to the off-state.

The NOR circuit 15 receives the shunt signal SHNT1 and the shunt signal SHNT2 as inputs and outputs a result of calculating a NOR of both the signals as the bypass enable signal BYP12. The NOR circuit 15 sets the bypass enable signal BYP12 to high only when both the shunt signal SHNT1 and the shunt signal SHNT2 are low.

For example, when the shunt signal SHNT1 changes from high to low in a state where the shunt signal SHNT1 is high and the shunt signal SHNT2 is low, the NOR circuit 15 sets the bypass enable signal BYP12 to high. At this time, the bypass switch 5 is switched from the off-state to the on-state. When the shunt signal SHNT2 thereafter changes from low to high, the bypass enable signal BYP12 is set to low. At this time, the bypass switch 5 is switched from the on-state to the off-state.

Next, an example of an operation of intermediate potential control according to the present embodiment will be described with reference to FIGS. 1 and 2, and also with reference to FIG. 3.

Even in this example, it is considered the scene in which the access to the SRAM 1 during the access period is terminated and then the access to the SRAM 2 is started. It is assumed that a state where there is no access to the SRAM 2 continues for a certain period or longer, and the internal potential VSINT2 of the circuit portion 2B on the SRAM 2 side is higher than a ground level by a certain level or more and reaches a saturation level due to the leakage current.

A clock signal at a constant cycle, and the chip enable signals CEN1 and CEN2 are input to the logic circuit 10 illustrated in FIG. 2.

As illustrated in FIG. 3, the chip enable signal CEN1 is low and the chip enable signal CEN2 is high during a period S1. At this time, the SRAM 1 is in the state of being accessed and the SRAM 2 is in the state of not being accessed. Meanwhile, at a final stage of the period S1, there may be a case where the chip enable signal CEN2 becomes low at a timing earlier than a timing at which the chip enable signal CEN1 becomes high as illustrated in FIG. 3. Further, there may be the opposite case. Even in such cases, the desired control is correctly performed in the present embodiment.

When the chip enable signal CEN1 is low and the chip enable signal CEN2 is high, the chip enable clock synchronization signal SYNC_CE1 output from the flip-flop circuit 11 is low, and the chip enable clock synchronization signal SYNC_CE2 output from the flip-flop circuit 12 is high. The shunt signal SHNT1 output from the NOR circuit 13 is high, and the shunt signal SHNT2 output from the NOR circuit 14 is low. The bypass enable signal BYP12 output from the NOR circuit 14 is low.

At this time, the shunt switch 3 is in the on-state, the shunt switch 4 is in the off-state, and the bypass switch 5 is in the off-state. In this state, the internal potential VSINT2 of the circuit portion 2B on the SRAM 2 side is higher than the ground level by the certain level or more and reaches the saturation level.

During a period S2, the chip enable signal CEN1 is high and the chip enable signal CEN2 is low. When the chip enable signal CEN1 becomes high, the access period of the SRAM 1 ends. Although the chip enable signal CEN2 becomes low, a substantial access period of the SRAM 2 does not start yet until the rising edge of the clock signal, and data read or write is not performed.

Even if the chip enable signal CEN1 changes from low to high and the chip enable signal CEN2 changes from high to low, the chip enable clock synchronization signal SYNC_CE1 output from the flip-flop circuit 11 remains low and the chip enable clock synchronization signal SYNC_CE2 output from the flip-flop circuit 12 remains high until the clock signal rises.

Since the chip enable signal CEN1 changes from low to high, the shunt signal SHNT1 output from the NOR circuit 13 changes from high to low. Although the chip enable signal CEN2 was changed from high to low, the chip enable clock synchronization signal SYNC_CE2 remains high, and thus, the shunt signal SHNT2 output from the NOR circuit 14 remains low. Since the shunt signal SHNT1 changes from high to low and the shunt signal SHNT2 remains low, the bypass enable signal BYP12 output from the NOR circuit 14 becomes high.

At this time, the shunt switch 3 is in the off-state, the shunt switch 4 is in the off-state, and the bypass switch 5 is in the on-state. In this state, the internal potential VSINT1 of the circuit portion 1B and the internal potential VSINT2 of the circuit portion 2B are averaged to have the same potential. That is, the internal potential VSINT2 of the circuit portion 2B drops from the saturation level to a level about the half thereof, and the internal potential VSINT1 of the circuit portion 1B at the ground level immediately rises to the level about the half of the above saturation level.

During a period S3, the chip enable signal CEN1 is high and the chip enable signal CEN2 is low. When the clock signal rises, the operation enters the access period of the SRAM 2, and the data read or write is performed. At this time, the chip enable clock synchronization signal SYNC_CE1 output from the flip-flop circuit 11 becomes high, and the chip enable clock synchronization signal SYNC_CE2 output from the flip-flop circuit 12 becomes low. The shunt signal SHNT1 output from the NOR circuit 13 remains low, but the shunt signal SHNT2 output from the NOR circuit 14 becomes high. The bypass enable signal BYP12 output from the NOR circuit 14 becomes low.

At this time, the shunt switch 3 is in the off-state, the shunt switch 4 is in the on-state, and the bypass switch 5 is in the off-state. In this state, the internal potential VSINT1 of the circuit portion 1B has already reached a level higher than the ground level by the certain level or more.

Figure 4:
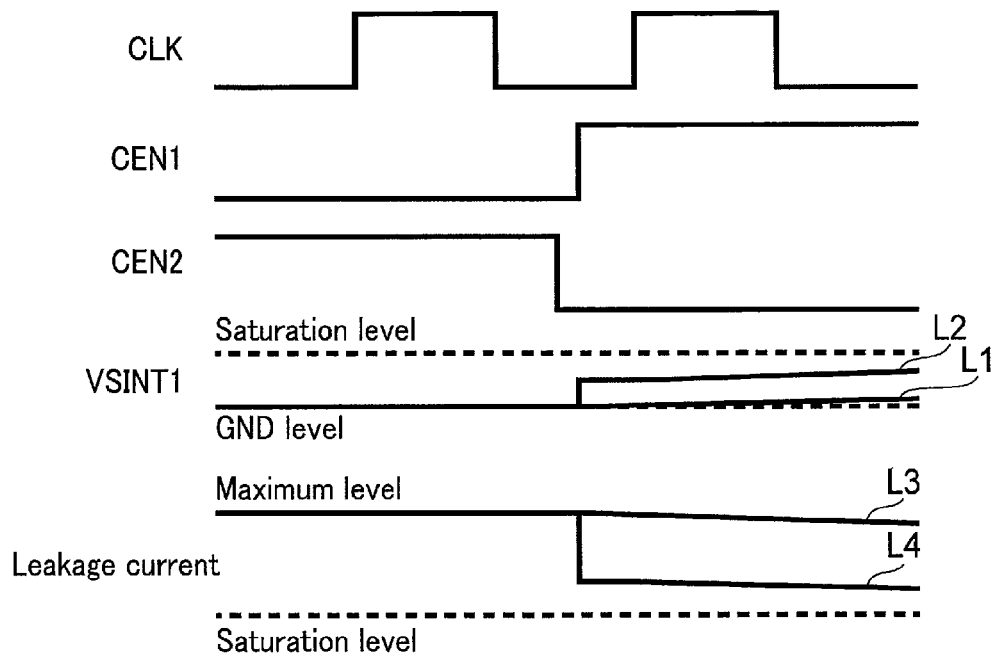
FIG. 4 is a view illustrating a change in an internal potential and a change in a leakage current accompanying thereto in comparison between a general technique and a technique of the embodiment.

FIG. 4 is a view illustrating a change in the internal potential VSINT1 of the circuit portion 1B caused by the above-described operation and a change in the leakage current accompanying thereto in comparison between a general technique and a technique of the present embodiment.

As illustrated in FIG. 4, when the chip enable signal CEN1 is low and the chip enable signal CEN2 is high, the internal potential VSINT1 of the circuit portion 1B is at the ground level. At this time, the leakage current of the SRAM 1 continuously flows. Thereafter, the chip enable signal CEN1 changes from low to high and the chip enable signal CEN2 changes from high to low.

Here, in the case of using the general technique, the internal potential VSINT1 of the circuit portion 1B rises due to an effect of a leakage current of the SRAM 1 after the chip enable signal CEN1 changes from low to high, but rises little by little as indicated by a reference sign L1. As a result, the continuously-flowing leakage current falls little by little as indicated by a reference sign L3.

By contrast, in the present embodiment, when the chip enable signal CEN1 changes from low to high, the bypass switch 5 is turned on and the internal potential VSINT1 of the circuit portion 1B and the internal potential VSINT2 of the circuit portion 2B are averaged. Thus, the internal potential VSINT1 of the circuit portion 1B at the ground level immediately rises to the level about the half of the saturation level as indicated by a reference sign L2, and gradually rises due to the leakage effect of the SRAM 1 even after then. As a result, the leakage current falls significantly as indicated by a reference sign L4 and continues to gradually fall even after then.

Figure 5:
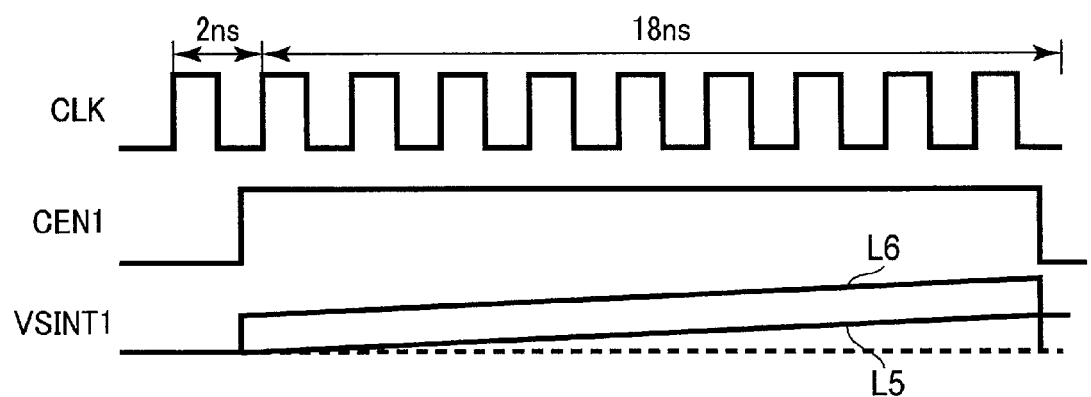
FIG. 5 is a view illustrating a difference in an effect when a non-access period is long in comparison between the general technique and the technique of the embodiment.

In addition, when an activation rate of the SRAM 1 is low and the state where the chip enable signal CEN1 is high continues long (when the non-access period of the SRAM 1 is long), for example, as illustrated in FIG. 5, a difference between the general technique and the present embodiment becomes more remarkable. In the present embodiment, the internal potential VSINT1 becomes a high level from the moment when the chip enable signal CEN1 becomes high as indicated by a reference sign L6 and rises even after then to reach a still higher level. In the case of using the general technique, however, the internal potential VSINT1 rises little by little as indicated by a reference sign L5 and reaches the level about the half of that in the present embodiment at the final stage. As a result, a reduction amount of the leakage current is greatly different between the general technique and the present embodiment, so that a large difference appears in the reduction amount of the current consumption of the entire circuit.

In this manner, the internal potential at the ground level is immediately increased after the access of the accessing SRAM is terminated in the present embodiment, and thus, it is possible to reduce the leakage current from the early stage of the non-access period of the SRAM and to reduce the current consumption of the entire circuit.

In the above-described embodiment, the case where the logic circuit 10 uses the chip enable signal supplied to each of the SRAM 1 and the SRAM 2 was exemplified. Instead, it may be configured such that the same processing is performed using address signals (signals including logical addresses) to be supplied to SRAM 1 and SRAM 2, respectively.

Further, in the above-described embodiment, the case of adjusting the internal potential in units of SRAMs was exemplified. Instead, it may be configured such that an internal potential is adjusted in units of arrays for a plurality of arrays forming an SRAM.

In this case, specifically, it is assumed that each of the SRAM 1 and the SRAM 2 illustrated in FIG. 1 has a plurality of arrays, and it is configured such that internal potential generation circuits 1A and 2A, shunt switches 3 and 4, a bypass switch 5, a bypass line 101, and a logic circuit 10 are provided for each array. Further, it may be configured such that an array selection signal (enable signal) with respect to each array is input to the corresponding logic circuit 10, and the logic circuit 10 performs processing using the selection signal instead of a chip enable signal. Further, it may be configured such that the same processing is performed using address signals with respect to the respective arrays instead of using the selection signals with respect to the respective arrays.

As described in detail above, it is possible to provide the integrated circuit capable of obtaining the leakage current reduction effect in a short time according to the embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made. The accompanying claims and their equivalents are intended to cover such forms or modifications as would fall within the scope of the inventions.

The invention claimed is:

1. An integrated circuit comprising:
   a plurality of SRAMs including a first SRAM and a second SRAM; and
   a switching unit that enables switching between an electrically connected state where a first circuit portion on a source side of the first SRAM is electrically connected with a second circuit portion on a source side of the second SRAM and an electrically disconnected state where the first circuit portion is electrically disconnected from the second circuit portion,
   wherein the switching unit electrically connects the first circuit portion with the second circuit portion, when each of the first circuit portion and the second circuit portion is electrically disconnected from a ground, after an access to the first SRAM is terminated and before an access to the second SRAM is started.

2. The integrated circuit according to claim 1, wherein the switching unit enables switching between the electrically connected state and the electrically disconnected state with respect to connection of the first circuit portion not only with the second circuit portion but also with a circuit portion on a source side of other SRAM.

3. The integrated circuit according to claim 1, further comprising a bypass line that connects the first circuit portion and the second circuit portion,
   wherein the switching unit is provided at the bypass line.

4. The integrated circuit according to claim 1, wherein the switching unit electrically connects the first circuit portion with the second circuit portion during a non-access period of each of the first SRAM and the second SRAM.

5. The integrated circuit according to claim 1, wherein the switching unit electrically connects the first circuit portion with the second circuit portion after the first circuit portion is electrically disconnected from a ground and before the second circuit portion is electrically connected with the ground.

6. The integrated circuit according to claim 1, further comprising a logic circuit that generates a signal for operating the switching unit by using enable signals supplied respectively to the first SRAM and the second SRAM.

7. The integrated circuit according to claim 1, further comprising a logic circuit that generates a signal for operating the switching unit by using address signals supplied respectively to the first SRAM and the second SRAM.

8. The integrated circuit according to claim 6, further comprising:
   a first switch that enables switching between an electrically connected state where the first circuit portion is electrically connected with a ground and an electrically disconnected state where the first circuit portion is electrically disconnected from the ground; and
   a second switch that enables switching between an electrically connected state where the second circuit portion is electrically connected with the ground and an electrically disconnected state where the second circuit portion is electrically disconnected from the ground,
   wherein the logic circuit comprises:
   a function of generating a signal for operating the first switch such that the first circuit portion is electrically disconnected from the ground at a first timing; and
   a function of generating a signal for operating the second switch such that the second circuit portion is electrically connected with the ground at a second timing later than the first timing.

9. The integrated circuit according to claim 8, wherein the switching unit is a switch configured using a transistor.

10. An integrated circuit comprising:
    a plurality of SRAMs including a first SRAM having arrays and a second SRAM having arrays; and
    a switching unit that enables switching, for each array, between an electrically connected state where a first circuit portion on a source side of the first SRAM is electrically connected with a second circuit portion on a source side of the second SRAM and an electrically disconnected state where the first circuit portion is electrically disconnected from the second circuit portion,
    wherein the switching unit electrically connects the first circuit portion with the second circuit portion, when each of the first circuit portion and the second circuit portion is electrically disconnected from a ground, after an access to the first SRAM is terminated and before an access to the second SRAM is started.

11. The integrated circuit according to claim 10, further comprising a logic circuit that generates a signal for operating the switching unit by using an array selection signal with respect to each array.

12. The integrated circuit according to claim 10, further comprising a logic circuit that generates a signal for operating the switching unit by using address signals supplied respectively to the first SRAM and the second SRAM, for each array.

* * * * *